(12) United States Patent
Patino

(10) Patent No.: US 9,247,681 B2
(45) Date of Patent: Jan. 26, 2016

(54) ELECTRIC SHIELDING ENCLOSURE INCLUDING POWER PACK

(71) Applicant: RESEARCH IN MOTION LIMITED, Waterloo Ontario (CA)

(72) Inventor: Joseph Patino, Miramar, FL (US)

(73) Assignee: BlackBerry Limited, Waterloo, Ontario (CA)

( * ) Notice: Subject to any disclaimer, the term of this patent is extended or adjusted under 35 U.S.C. 154(b) by 344 days.

(21) Appl. No.: 13/852,357

(22) Filed: Mar. 28, 2013

(65) Prior Publication Data

US 2014/0293570 A1    Oct. 2, 2014

(51) Int. Cl.
H05K 7/00    (2006.01)
H05K 9/00    (2006.01)

(52) U.S. Cl.
CPC ................................ *H05K 9/0024* (2013.01)

(58) Field of Classification Search
USPC .................. 361/728–730, 752, 796, 800; 455/575.1–575.7
See application file for complete search history.

(56) References Cited

U.S. PATENT DOCUMENTS

| | | | |
|---|---|---|---|
| 6,590,150 B1 | 7/2003 | Kiefer | |
| 7,890,150 B2 * | 2/2011 | Lee | 455/575.1 |
| 8,208,980 B2 | 6/2012 | Wong et al. | |
| 8,279,623 B2 * | 10/2012 | Idzik et al. | 361/814 |
| 2011/0242725 A1 * | 10/2011 | Herrmann et al. | 361/306.2 |
| 2012/0309472 A1 | 12/2012 | Wong et al. | |

FOREIGN PATENT DOCUMENTS

| | | |
|---|---|---|
| JP | 2006060534 | 3/2006 |
| WO | 2008136238 | 11/2008 |

OTHER PUBLICATIONS

Extended European Search Report dated Sep. 2, 2013 for European Patent Application No. 13161777.

* cited by examiner

*Primary Examiner* — Hung S Bui
(74) *Attorney, Agent, or Firm* — Jeffrey N. Giunta; Fleit Gibbons Gutman Bongini & Bianco P.L.

(57) ABSTRACT

An electric shielding enclosure that encloses a volume. The electric shielding enclosure includes a conductive structure that partially encloses the volume and that has an edge defining an opening into the volume. A conductive power pack surface is configured to fill at least a part of the opening and has a number of conductive connections. The conductive connections include a first conductive connection located in proximity to a first point of the edge, and a second conductive connection located in proximity to a second point of the edge, where the second point is across the opening from the first point. Each of the conductive connections within the conductive connections is electrically coupled to the conductive structure.

14 Claims, 5 Drawing Sheets

ELECTRIC SHIELDING ENCLOSURE INCLUDING POWER PACK

FIELD OF THE DISCLOSURE

The present disclosure generally relates to electric shielding, and more particularly to electric shielding enclosures that include a power pack surface.

BACKGROUND

Many electronic devices include circuits or other components that are enclosed within electric shielding enclosures. Some devices include circuits or components that emit electromagnetic energy that is able to disturb other components of the device and are enclosed in an electric shielding enclosure to prevent emission of such energy outside of the enclosure. Some circuits or components are sensitive to static electric discharge or to exposure to electromagnetic energy that can adversely affect their operation. Such circuits or components are enclosed in an electric shielding enclosure to protect them from static electric discharge or interfering electromagnetic energy. Such electric shielding enclosures add to the size and weight of the device. In an example of decreasing device size, manufacturing tolerances for electric shielding enclosures and their neighboring structures within the device increase and add complexity and cost to the physical design of the device.

Decreasing the weight and size of electric shielding enclosures in electronic devices increases design flexibility and manufacturability of devices.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present disclosure, in which.

DETAILED DESCRIPTION

Figure 1:
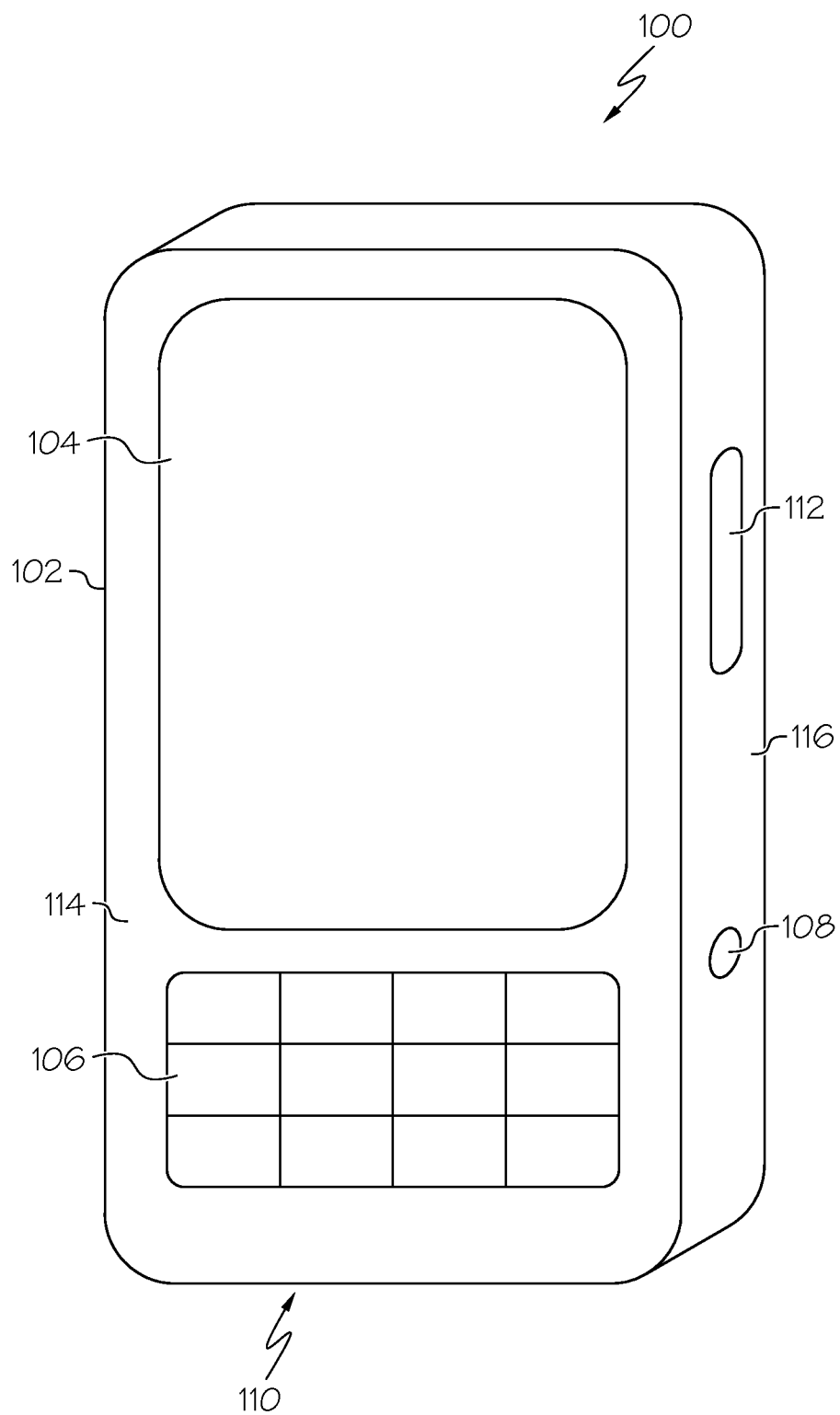
FIG. 1 illustrates an electronic device front view according to an example.

As required, detailed embodiments are disclosed herein; however, it is to be understood that the disclosed embodiments are merely examples and that the systems and methods described below can be embodied in various forms. Therefore, specific structural and functional details disclosed herein are not to be interpreted as limiting, but merely as a basis for the claims and as a representative basis for teaching one skilled in the art to variously employ the present subject matter in virtually any appropriately detailed structure and function. Further, the terms and phrases used herein are not intended to be limiting, but rather, to provide an understandable description of the concepts.

The terms "a" or "an", as used herein, are defined as one or more than one. The term plurality, as used herein, is defined as two or more than two. The term another, as used herein, is defined as at least a second or more. The terms "including" and "having," as used herein, are defined as comprising (i.e., open language). The term "coupled" as used herein (and variations such as "electrically coupled"), is defined as "connected," although not necessarily directly, and not necessarily mechanically. The term "configured to" describes hardware, software or a combination of hardware and software that is adapted to, set up, arranged, built, composed, constructed, designed or that has any combination of these characteristics to carry out a given function. The term "adapted to" describes hardware, software or a combination of hardware and software that is capable of, able to accommodate, to make, or that is suitable to carry out a given function. In the following discussion, "handheld" is used to describe items, such as "handheld devices," that are sized, designed and otherwise configured to be carried and operated while being held in a human hand.

Described below are circuits, devices, and other components that include an electrically conductive surface of a power pack as part of an electric shielding enclosure. The electric shielding enclosure in these examples encloses a volume and provides electrical isolation between objects in that enclosed volume and objects that are outside of the enclosed volume enclosed by the electric shielding enclosure.

In various examples, a power pack is able to have multiple electrical contacts or connections to electrically couple a conductive surface that is at the negative output potential of the power pack to suitable conductors of a device that are at an electrical ground potential for the device. In general, the negative voltage terminal of a power pack or battery provides an external electrical connection to a negative electrode of the battery or power pack. The negative electrode is connected in several examples through the negative voltage terminal to conductors of the electronic device that are at an electrical ground potential. In some examples, the negative electrode of a battery is formed by a foil or other conductive surface that extends over most of the battery's outer surface. This negative electrode is able to be electrically coupled to a case of the battery, or may, in some instances, itself form part or all of the case of the battery.

A battery is able to be contained within the conductive power pack surface in examples where the negative electrode forms the case of the battery. In one example, an exposed negative electrode for a battery is a negative electrode that forms the case of the battery where the portions of the negative electrode that are external to the battery, e.g., surfaces of the negative electrode that form the external part of the battery case, is not electrically insulated at some or points of the external case.

Such a conductive surface of the battery is able to form part of an electric shielding enclosure used to electrostatically isolate components. In one example, a battery that consists of cylindrical Li-Ion cells is assembled into a stainless steel "can" that is at the negative output voltage potential of the battery. Such a stainless steel "can" or other battery case structure is able to be a conductive power pack surface that is used to form part of an electric shielding enclosure. Generally speaking, the concepts described herein are not restricted to any particular materials. Although a conductive surface may include stainless steel, for example, other metals or conductive materials may be included in place or in addition to stainless steel. Further, a conductive surface need not be constructed exclusively from conductive materials.

The batteries or other power pack devices in some examples that have a conductive surface that forms a portion of an electric shielding enclosure are able to have multiple electrical contacts physically distributed around that conductive surface. For example, electrical contacts are able to be physically and electrically connected, and thereby electrically coupled, to the conductive power pack surface at opposite ends of a battery's longest dimension. Alternatively, or additionally, these electrical contacts are able to be placed at or near the corners of the power pack or battery. Such placement provides effective coupling to ground of electric fields that impact the conductive power pack surface at arbitrary locations. A power pack that has two or more electrical contacts attached at any points of the conductive power pack surface that are separated by a sufficient amount to cause electric fields impinging on the conductive power pack surface at arbitrary locations to be effectively coupled to the ground potential of the electronic device is similarly able to be part of an electric shielding enclosure.

In some examples, the conductive power pack surface has an insulating cover and multiple electrical contacts in physical contact with the conductive power pack surface are electrically coupled to other elements of the electric shielding enclosure. Electrical coupling of these multiple electrical contacts to the other elements of the electric shielding enclosure is able to be via a direct electrical connection to the other elements of the electric shielding enclosure or by a connection to a conductor of the device that is at a ground potential. The other elements of the electric shielding enclosure are also electrically coupled, either directly or indirectly, to a conductor of the device that is at ground potential, thereby completing the coupling of the conductive power pack surface to the other elements of the electric shielding enclosure through that conductor that is at ground potential. In further examples, the conductive power pack surface is physically exposed at one or more points where it is in physical contact with other components that form the electric shielding enclosure in order to form a direct electrical contact between the conductive power pack surface and the other components that form the electric shielding enclosure. Such a direct physical and electrical contact provides an effective coupling of all components of the electric shielding enclosure and the negative battery terminal.

The use of the conductive power pack surface as part of an electric shielding enclosure allows the large conductive surface of the power pack surface to be reused as an electric shield for sensitive components or certain circuits or components of an electronic device. This electric shielding enclosure is able to protect sensitive components from, for example, electrostatic discharge. The electric shielding enclosure is further able to provide a shield for Electro-Magnetic Interference (EMI) that may enter the enclosure and affect components therein, or the electric shielding enclosure is able to act as a shield from EMI that may be emitted by components within the enclosure. Further, the use of the conductive power pack surface as part of an electric shielding enclosure allows the large conductive surface of the power pack surface to be reused to reduce the Specific Absorption Rate (SAR) of the device incorporating that enclosure. Shielding may help realize any of several other potential benefits as well, which may vary from device to device, such as improved hearing-aid compatibility.

Reusing the conductive power pack surface as a portion of an electric shielding enclosure supports more compact and lighter physical designs of electronic devices. In device designs that include a suitable power pack, more compact designs can be realized by obviating a one separate conductive surface of the electric shielding enclosure and any physical separation that may be required due to, for example, manufacturing design tolerances, heat dissipation, and the like. The extra weight of the electronic device is further saved by using the conductive power pack surface as a portion of an electric shielding enclosure. Considerations such as size and weight may be important for portable electronic devices in general and handheld electronic devices in particular.

FIG. 1 illustrates an electronic device front view 100. In one example, the electronic device front view 100 depicts in this example an electronic device 110 that is a handheld smartphone used to perform wireless voice, data, or both voice and data communications. Although this example describes a smartphone electronic device 110, it is clear that the aspects of the examples described below are applicable to a wide range of electronic devices of varying physical sizes.

The electronic device front view 100 depicts an electronic device 110 that consists of various components, such as electronic circuits, power packs such as batteries, user interface elements, and so forth, that are enclosed within a case 102. The electronic device front view 100 shows a case front 114, which is the front side of the case 102. The case front 114 of case 102 in this example has a number of user interface components, such as a display screen 104 and input buttons 106. In various examples, the display screen 104 is able to be a touch screen input device that displays images and allows a user to touch a portion of the displayed image to indicate a selection or to otherwise provide an input to processing within the electronic device 110.

In various examples, further electronic devices are able to not have input buttons 106 and receive all user inputs through the touch screen operation of a display screen 104. The case 102 further has electrical connections, such as power plug 108 and data connection 112, located on a case side 116 of the case 102. These electrical connections are used to connect circuits within the electronic device 110 to external components, such as power supplies, other data processing or communications devices, any other type of device, or combinations of these.

Figure 2:
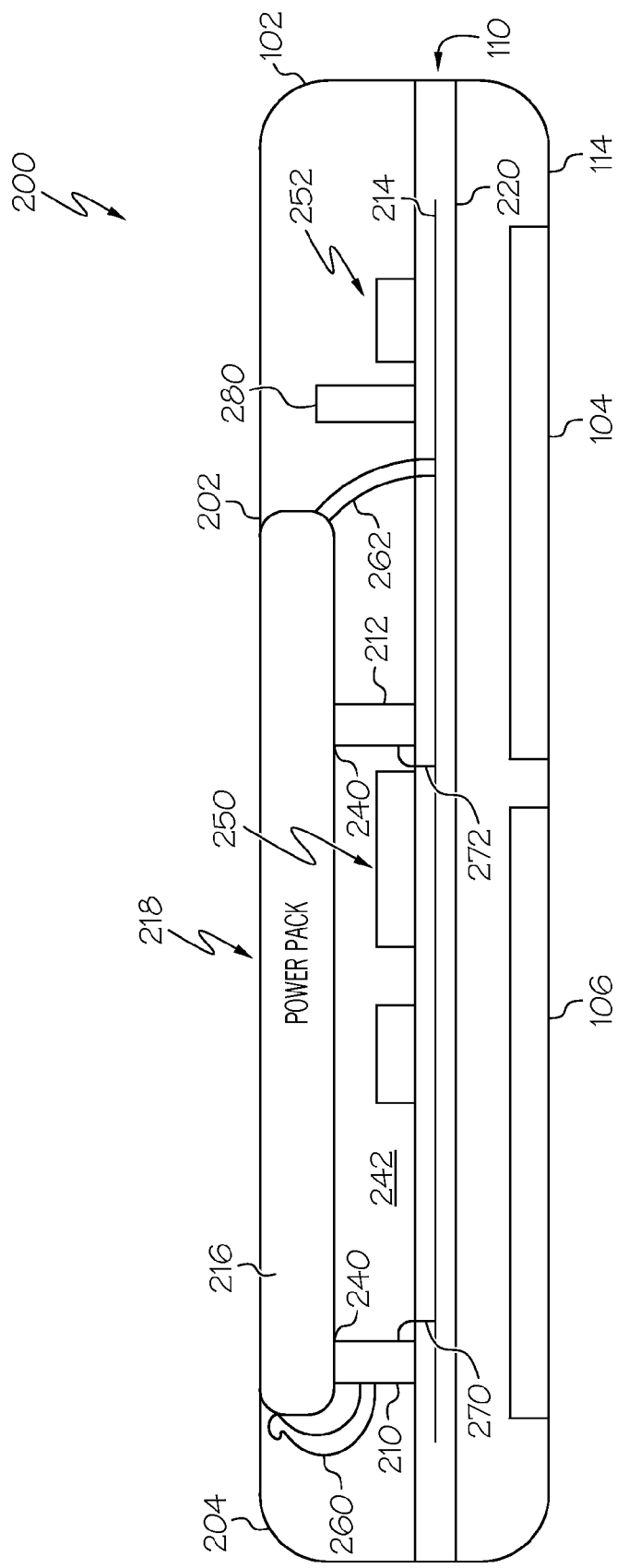
FIG. 2 illustrates a side view cross section of the electronic device depicted in FIG. 1.

FIG. 2 illustrates a side view cross section 200 of the electronic device 110 depicted in FIG. 1. The side view cross section 200 illustrates components within the case 102 of the electronic device 110. The side view cross section 200 of the electronic device 110 presents a view of the electronic device 110 as though looking into the case side 116 with the case front 114 being towards the bottom of FIG. 2. The display screen 104 and input buttons 106 are depicted on the case front 114 and extending into the case 102.

The side view cross section 200 of the electronic device 110 further depicts a power pack 202 that is attached to the case 102 of the electronic device 110. The power pack 202 in this example is an electrochemical cell battery, such as a lithium-ion (Li-Ion) battery, that stores electrical energy to power the various components of the electronic device 110. In further examples, the power pack 202 is able to be any type of energy producing component of an electronic device that may or may not be rechargeable.

The power pack 202 is used in this example to provide electrical power to electrical circuits and other components within the electronic device 110. The power pack 202 provides electrical energy to power components of display screen 104, such as a backlight or other components thereon. In addition, various electronic devices include different components that consume electrical energy, such as vibration motors, sound generators, any other electrical consuming components, or combinations of these.

The power pack 202 in this example has a conductive power pack surface 216 that forms an outer surface of the power pack 202. The power pack 202 in this example is located within the case 102. The conductive power pack surface 216 in this example is connected to the ground potential of the electrical circuits of the electronic device. Therefore, the conductive power pack surface 216 is also at a voltage potential that is a ground potential relative to other voltage potentials within the electronic device 110. In one example, the power pack 202 produces an output voltage between the case of the power pack 202 and one or more outputs of the power pack 202 such that the one or more outputs of the power pack 202 have a higher potential than the conductive power pack surface 216. In one example, the conductive power pack surface 216 has a number of conductive connections that connect the conductive power pack surface 216 to ground plane conductors within the electronic device 110. In this discussion, the term conductive connection refers to a connection that is at least electrically conductive.

The side view cross section 200 depicts an electronic circuit board 220 within the case 102 of the electronic device 110. The electronic circuit board 220 includes a number of electronic and electrical circuits that support the operation of the electronic device 110. An electric shielding enclosure 218 is mounted on the electronic circuit board 220 and encloses a volume 242 within the case 102. The illustrated components of the electric shielding enclosure 218 include the conductive power pack surface 216, discussed above, and a conductive structure that forms other components of the electric shielding enclosure. The conductive structure may include one or more conductive surfaces. The side view cross section 200 illustrates portions of the conductive structure that forms other components of the electric shielding enclosure that include a first wall 210, a second wall 212, and a ground plane 214 that is a conductive layer of the electronic circuit board 220. In the illustrated example, the first wall 210 is electrically coupled to the ground plane 214 through a first ground connection 270, and the second wall 212 is electrically coupled to the ground plane 214 through a second ground connection 272.

The conductive structure that forms other components of the electric shielding enclosure in this example is a conductive structure that partially encloses the volume 242. The conductive structure that forms other components of the electric shielding enclosure, and that partially encloses the volume 242 further includes an edge that defines an opening 240 into the volume 242 that is enclosed by the electric shielding enclosure 218. In the illustrated example, the edge that defines the opening 240 into the volume 242 are the ends of the above described walls that are located at the "top" of the conductive structure that forms other components of the electric shielding enclosure. In the illustrated example, the conductive power pack surface 216 physically contacts the conductive structure that forms other components of the electric shielding enclosure at the edge that defines the opening 240. The conductive power pack surface 216 is configured to fill the opening 240 in this example by being physically dimensioned to extend across the opening 240 when the conductive power pack surface 216 is in proximity to the opening 240. In this context, the conductive power pack surface 216 is considered in proximity to the opening 240 when the combination of the conductive power pack surface 216 and the other components of the electric shielding enclosure operate to shield components in the volume 242 from electromagnetic energy. When the conductive power pack surface 216 is in proximity to and fills the opening 240, the combination of the conductive power pack surface 216 and the conductive structure that forms other components of the electric shielding enclosure creates an electric shielding enclosure that completely encloses the volume 242.

In this illustration, the conductive structure that forms other components of the electric shielding enclosure further includes other walls that extend between the first wall 210 and the second wall 212 in a horizontal direction and from the electronic circuit board 220 to the conductive power pack surface 216 in the vertical direction. Such other walls are able to be located at both ends of the first wall 210 and the second wall 212, i.e., one at an end that is closest to and another at an end that is farthest from the point of view presented in this illustration. These additional conductive surfaces of the conductive structure that forms other components of the electric shielding enclosure are not shown in this illustration in order to more clearly present relevant concepts of this example. It is clear that the electric shielding enclosure 218 includes such conductive surface walls to form a complete enclosure that encloses the volume 242.

The electronic circuit board 220 has enclosed circuits 250 and exposed circuits 252. The enclosed circuits 250 are located in the area of the electronic circuit board that is enclosed by the electric shielding enclosure 218, i.e., circuits that are within the volume 242. As depicted, the ground plane 214 under the enclosed circuits 250 is a ground plane of the enclosed circuits because it extends beneath the enclosed circuits 250 and serves as a ground plane conductor for the enclosed circuits 250. Further, the portion of the ground plane 214 under the enclosed circuits 250 forms a portion of the conductive structure and the electric shielding enclosure 218. The electric shielding enclosure 218 operates to electromagnetically and electrostatically isolate the enclosed circuits 250 from objects that are outside of the electric shielding enclosure 218. For example, Radio Frequency (RF) energy emitted by the enclosed circuits 250 is not emitted outside the electric shielding enclosure 218. Further, the enclosed circuits 250 are protected from electrostatic discharge originating from objects outside of the electric shielding enclosure 218. Such protection is not provided to the exposed circuits 252 by the electric shielding enclosure 218. In general, protection of components located outside of the electric shielding enclosure 218 is provided by other design techniques components located outside of an electric shielding enclosure 218 are of a nature that does not require shielding of their emissions or additional protection from electrostatic discharge.

In one example, the electronic device 110 is a wireless communications device that is able to support wireless communication with other equipment (not shown). The circuit board 220 in this example includes an antenna 280 that is used to support wireless communications by emitting, receiving, or emitting and receiving radio frequency (RF) energy. In examples where the antenna 280 emits energy, the presence of the electric shielding enclosure 218 is able to alter the electromagnetic field emitted by the antenna 280. In such an example, the electric shielding enclosure 218 that includes the conductive power pack surface 216 of the power pack 202 is able to serve to modify the RF energy emission pattern. The location and design of the electric shielding enclosure 218 relative to the antenna 280 is also able to alter the amount of emitted energy delivered to a user of the electronic device 110, a value indicated by a quantity referred to as the Specific Absorption Rate (SAR). Adjusting the relative location of the antenna 280 and the electric shielding enclosure 218 through the selection of various component layout designs is able to adjust the RF energy emission pattern and may also reduce the SAR of the device.

The power pack 202 in this example is coupled to and thereby forms a part of the case back 204 that is part of the enclosure or case 102 of the electronic device 110. In this example, the power pack 202 mounts into an opening of the case 102 and fits into a cavity within the electronic device 110. The power pack 202 in this example, and its conductive power pack surface 216, are located within the case 102. The electric shielding enclosure, which contains the elements described above, are also enclosed within the case 102. It is clear that in further examples, the components of the electronic device 110 are able to have physical designs where portions of one or both of the conductive power pack surface 216 and the electric shielding enclosure 218 are able to be only partially within the case 102. The power pack 202 in one example is able to be removed from the case 102. In further examples, the power pack 202 is able to be removably or fixedly mounted at any location within the electronic device 110 such that it is in physical contact with, or located in proximity to, the conductive structure that forms other components of the electric shielding enclosure. In this example, the power pack 202 has a conductive power pack surface 216 that is the "can" of the battery, which is the container in one example that forms the negative electrode of the battery forming the power pack 202 in this example. In further examples, the conductive power pack surface 216 is alternatively able to be the foil used as an electrode of the battery forming the power pack 202. The conductive surface of the conductive power pack surface 216 in various examples is able to act as a conductive portion of an electric shielding enclosure 218.

In general, the negative voltage terminal of a power pack 202 or battery provides an external electrical connection to a negative electrode of the battery or power pack 202. The negative electrode is connected in several examples through the negative voltage terminal to conductors of the electronic device that are at electrical ground potential, such as the ground plane 214. In some examples, the negative electrode of a battery is formed by a foil or other conductive surface that extends over most of the battery's surface. This negative electrode is able to be electrically coupled to a case of the battery, or may, in some instances, itself form part or all of the case of the battery. In some examples, a battery is contained within a case that is formed by the conductive power pack surface 216, which is also the negative electrode of the battery. An exposed negative electrode in one example is a physical enclosing "case" of such a battery where the portions of that negative electrode that are external to the battery, e.g., surfaces of the negative electrode that form the external part of the battery case, are not electrically insulated at some or points of the external case. An exposed negative electrode is able to consist of a completely uninsulated battery case, or alternatively is able to consist of a partially insulated batter case where one or more portions of a conductive power pack surface 216 is exposed or able to be electrically coupled to a connection external to the insulation. In further examples, a power pack case itself is able to be electrically insulated without any exposed portions and conductive connections are able to be coupled to the conductive power pack surface 216 by, for example, wires or other conductive structures that are electrically coupled to the conductive power pack surface 216.

In some examples, the conductive power pack surface 216 is coupled to the conductive structure partially enclosing the volume 242 at several points by physical contact between an exposed negative electrode of a battery contained within the conductive power pack surface 216 and the conductive structure partially enclosing the volume 242. In an example of a power pack 202 that has a conductive power pack surface 216 that is an exposed negative electrode, a number of conductive connections are able to couple the conductive power pack surface 216, i.e., the exposed negative electrode, to the conductive structure partially enclosing the volume 242 by physical and electrical contact between the exposed negative electrode and multiple points of the edge defining the opening 240. In one example, the physical and electrical contact between the exposed negative electrode and multiple points of the edge defining the opening 240 electrically couples the exposed negative electrode and the conductive structure partially enclosing the volume 242 along substantially an entirety of the edge defining the opening. In another example, the conductive structure partially enclosing the volume 242 is electrically coupled to the exposed negative electrode at a plurality of locations along the edge defining the opening.

In the illustrated example, the conductive power pack surface 216 is dimensioned to protrude into the case 102 when it is mounted in the case 102 so as to be in physical contact with the edge of the first wall 210 and the edge of the second wall 212, and is also in physical contact with the edge of other conductive structures that form other components of the electric shielding enclosure. In the illustrated example, the conductive power pack surface 216 is in electrical contact with the opening 240 of the conductive structure that forms other components of the electric shielding enclosure. The conductive power pack surface 216 in this example itself forms a portion of the electric shielding enclosure 218 to create a complete enclosure around the enclosed volume 242. The electric shielding enclosure 218 is formed due to the electrical contact between and the physical proximity of the conductive power pack surface 216 and the opening 240 of the conductive structure that forms other components of the electric shielding enclosure.

The conductive power pack surface 216 in various examples forms a conductive electrical contact at some or all points of physical contact with the conductive structure that forms other components of the electric shielding enclosure. In some examples, the edge defining the opening 240 of the conductive structure that forms other components of the electric shielding enclosure contacts the conductive power pack surface 216 at multiple locations along the edge defining the opening 240. In one example, the conductive structures that form other components of the electric shielding enclosure electrically contact the conductive power pack surface 216 continuously along substantially an entirety of the edge defining the opening 240 of the other components of the electric shielding enclosure. In this context, the conductive power pack surface 216 electrically contacts the opening 240 along substantially the entirety of the edge defining the opening by forming an electrical contact there-between that is sufficient to cause the electric shielding enclosure to provide shielding of electromagnetic energy. In further examples, the conductive power pack surface 216 is electrically insulated at some or all points of physical contact with the conductive structure that forms other components of the electric shielding enclosure. In examples where the conductive power pack surface 216 is electrically insulated at all points of physical contact with the conductive structure that forms other components of the electric shielding enclosure, other electrical connections are provided to electrically connect these two conductors, such as multiple connections through a common grounding conductor of an electronic device.

In some examples, the conductive power pack surface 216 has a number of electrically conductive connections to conductors of the electronic device 110 that are at a ground potential of the electronic device. In one example of a conductive power pack surface 216 that is electrically insulated from the conductive structure that forms other components of the electric shielding enclosure, the conductive power pack surface 216 has a number of electrically conducive connections to one or more conductors of the electronic device 110 that are at a ground electrical potential of the electronic device. The conductive structure that forms other components of the electric shielding enclosure 218 in such examples is also electrically coupled to the ground potential of the electronic device. In such an example, the conductive power pack surface 216 is electrically coupled to the conductive structure that forms other components of the electric shielding enclosure 218 through the electrical couponing of those components to the ground potential of the electronic device. In some examples, a conductive power pack surface 216 that is electrically coupled to the conductive structure that forms other components of the electric shielding enclosure also has a number of electrically conducive connections to one or more conductors of the electronic device 110 that are at the ground electrical potential.

The illustrated electric shielding enclosure 218 depicts a first power pack surface contact 260 and a second power pack surface contact 262. The first power pack surface contact 260 is physically and conductively coupled to the first wall 210. The second power pack surface contact 262 is physically and conductively coupled to the ground plane 214 within the circuit board 220. The first power pack surface contact 260 and the second power pack surface contact 262 are each further configured to engage a conductive surface of the power pack conductive surface 216. The first power pack surface contact 260 is configured to physically and electrically engage the conductive power pack surface 216 so as to form a first conductive connection that is connected at a first point of the conductive power pack surface 216. The second power pack surface contact 262 is configured to physically and electrically engage the conductive power pack surface 216 so as to form a second conductive connection that is connected at a second point of the conductive power pack surface, where the second point is located across the opening 240 from the first point. As depicted, the first power pack surface contact 260 is connected to the conductive power pack surface 216 at the first point, which is located opposite the opening 240 along a dimension of the power pack 202 from the second point at which the second power pack surface contact 262 is connected to the conductive power pack surface 216.

In further examples, various electrical couplings are able to be provided between the conductive power pack surface 216 and the conductive structure that forms other components of the electric shielding enclosure, which is a conductive structure partially enclosing the volume 242. Such electrical couplings are able to be either directly between these components, or through connections to a conductor that is at a ground potential for the electronic device. A conductor that is at a ground potential for the electronic device is able to be located on the circuit board 220, or located at a location apart from the circuit board 220.

In one example, the conductive power pack surface 216 has two or more conductive connections. These conductive connections include at least a first conductive connection, such as is formed by an electrical connection at a first point, which is the point of contact between the first power pack surface contact 260 and the conductive power pack surface 216. The conductive connections further include a second conductive connection at a second point, such as is formed by an electrical connection at the point of contact between the second power pack surface contact 262 and the conductive power pack surface 216. In this example, the second point is located across the opening 240 from the first point. In this context, two points are located across the opening 240 from each other when a line connecting the two points intersects a portion of the opening 240. Further, in the illustrated example, each of the conductive connections of the conductive connections is electrically coupled to the conductive structure forming the other components of the electric shielding enclosure by all of these components being coupled to the ground plane 214.

Figure 3:
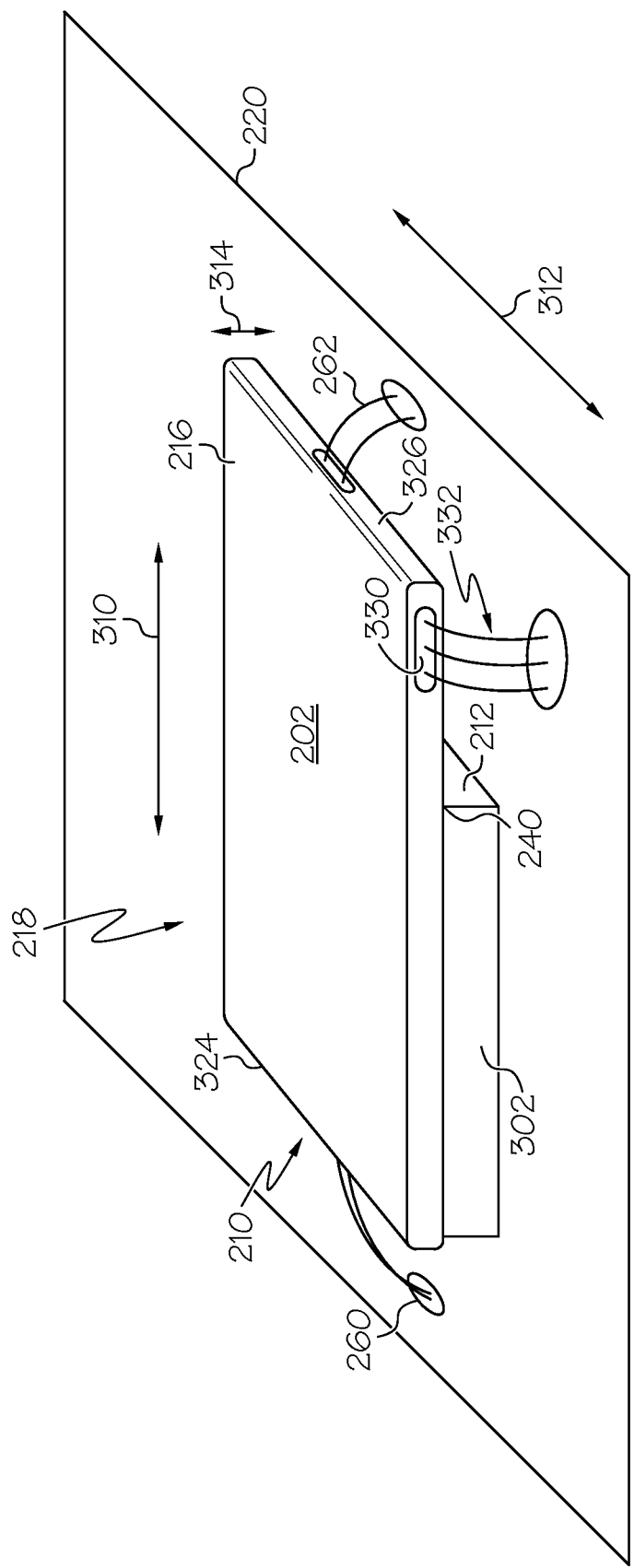
FIG. 3 illustrates an electric shielding enclosure view, according to an example.

FIG. 3 illustrates an electric shielding enclosure view 300, according to an example. The electric shielding enclosure view 300 depicts a different view of the electric shielding enclosure 218 and circuit board 220 than provided by the side view cross section 200, described above. The electric shielding enclosure view 300 depicts three mutually orthogonal dimensions for certain features of the circuit board 220 and the electric shielding enclosure 218. A width dimension 310 is shown as extending generally from side-to-side and is parallel to the surface of the circuit board 220. A depth dimension 312 is shown as extending perpendicularly from the width dimension 310 and is also parallel to the surface of the circuit board 220. The width dimension 310 and the depth dimension 312 in this example define a plane that is parallel to the surface of the circuit board 220. A height dimension 314 is a third illustrated dimension that extends perpendicularly from the plane of the circuit board 220.

The electric shielding enclosure view 300 depicts the circuit board 220 to which several vertical conductive "walls" are attached to form a conductive structure that partially encloses a volume. The conductive structure that partially encloses a volume in this example is a conductive structure that forms other components of the electric shielding enclosure and includes the second wall 212 of the conductive structure, which is connected to the circuit board 220 and rises perpendicularly from the circuit board 220 along the height dimension 314. The conductive structure also includes a front wall 302 that also rises perpendicularly from the circuit board 220 along the height dimension 314, and that extends along the width dimension 310, which is a perpendicular direction from the plane of the second wall 212. The front wall 302 is shown to extend from the second wall 212 to the first wall 210 and forms a front side of the electric shielding enclosure 218. The first wall 210 is not visible in this view due to being blocked by the front wall 302 and is indicated as being located "behind" the front wall 302. The side view cross section 200 of the electronic device 110 depicts that the first wall 210 is parallel to the second wall 212. A back wall (not shown) is further present behind the front wall but not visible due to being blocked by other depicted components. The back wall extends along the width dimension 310 from the first wall 210 to the second wall 212 to form a rear side of the electric shielding enclosure 218.

Several "wall" elements, including the first wall 210, second wall 212, front wall 302, and back wall partially enclose a volume and further define an opening 240 into that volume. The volume is further bordered by the ground plane 214 that is located in the circuit board 220 beneath the volume, as is described above with regards to FIG. 2. The opening 240 into the volume is located in this example at the top of these elements, which is the end of the wall elements along the height dimension 314 that is opposite the circuit board 220.

The electric shielding enclosure view 300 depicts the power pack 202, and its electrically conductive power pack surface 216, as being located above and in contact at the opening 240 defined by the wall elements including the first wall 210, the second wall 212, and the front wall 302. The electrically conductive power pack surface 216 of the power pack 202 in this example fills the opening 240 that is defined by the top of the conductive structure formed by the first wall 210, the second wall 212, the front wall 302, and the back wall (which is obscured by other depicted elements). The conductive structure form by these walls in combination with the ground plane 214, which is located within circuit board 220, and the conductive power pack surface 216 forms an electric shielding enclosure 218 that completely encloses a volume and electrically isolates components within that volume from objects outside of the electric shielding enclosure. In further examples, the conductive power pack surface 216 does not completely fill the opening 240, but rather fills only part of the opening 240. In examples where the conductive power pack surface 216 fills only part of the opening 240, another conductive surface (not shown) is able to be physically and electrically coupled to the conductive power pack surface 216 that fills the remainder of the opening 240 that is not filled by the conductive power pack surface 216.

The power pack 202 is shown to have two conductive connections that electrically couple the conductive power pack surface 216 to the electrical ground potential of the circuit board 220, and ultimately electrically couple the conductive power pack surface to the conductive structure that partially encloses the volume 242. A first power pack surface contact 260 forms a first conductive connection at a first point that is located on a first edge 324 of the conductive power pack surface 216. A second power pack surface contact 262 forms a second conductive connection at a second point that is located on a second edge 326 of the conductive power pack surface 216. The first power pack surface contact 260 and the second power pack surface contact 262 couple the first point and the second point, respectively, of their respective edges of the conductive power pack surface 216 to the conductive structure that partially encloses the volume 242. In the illustrated example, the first point is coupled to the first wall 210, and the second power pack surface contact 262 electrically couples the first point to the ground plane 214 of the circuit board 220. As discussed above, the conductive structure that forms other components of the electric shielding enclosure and that partially encloses the volume 242 is also connected to the electrical ground of the circuit board 220. Therefore these two conductive connections are each electrically coupled to the conductive structure that partially encloses the volume 242.

In the illustrated example, the conductive power pack surface 216 has its longest dimension along the width dimension 310. The length of the conductive power pack surface 216 is shorter along both the depth dimension 312 and the height dimension 314 than its length along the width dimension 310. In this example, the first edge 324 and the second edge 326 are separated by the length of the conductive power pack surface 216 along the width dimension 310, which is the longest length of the conductive power pack surface 216 in any of the three orthogonal dimensions. Therefore, the longest length of the conductive power pack surface (i.e., the width dimension) separates the first edge 324 and the second edge 326 in this example. Therefore a first conductive connection at a first point, which is a point of contact between the first power pack surface contact 260 and the first edge 324, and a second conductive connection at a second point, which is a point of contact between the second power pack surface contact 262 and the second edge 326, are separated in this example by the longest length of the power pack 202. Although the illustrated example depicts conductive contacts that are located on the edges of the conductive power pack surface 216, in alternative configurations the locations of points where conductive connections are coupled to the conductive power pack surface 216 are able to be located near the edges of the power pack surface 216. In this context, a conductive contact that creates a conductive path for electrical charges that accumulate on a particular edge of a conductive power pack surface 216 is considered to be located near that particular edge.

Although the electric shielding enclosure view 300 depicts a conductive power pack surface 216 that has two grounding connections, in further examples any number of grounding connections are able to be connected to the conductive power pack surface 216. For example, more grounding connections are able to be located along one or both of the first edge 324 and the second edge 326. Furthermore, grounding connections are able to be located anywhere on the surface of the conductive power pack surface 216. In an alternative example, four grounding electrical connections are able to be located on the conductive power pack surface 216 with one such grounding electrical connection located on or near each corner of the conductive power pack surface 216.

The power pack 202 has several power conductors 332 that connect to the power pack 202 at a power pack connection 330. The power pack connection 330 includes, for example, a positive output terminal for the power pack 202 in order to access the positive output voltage of the power pack 202. The power conductors 332 connect the positive output terminal for the power pack 202 and conduct electrical energy from the power pack to components on the circuit board 220.

Figure 4:
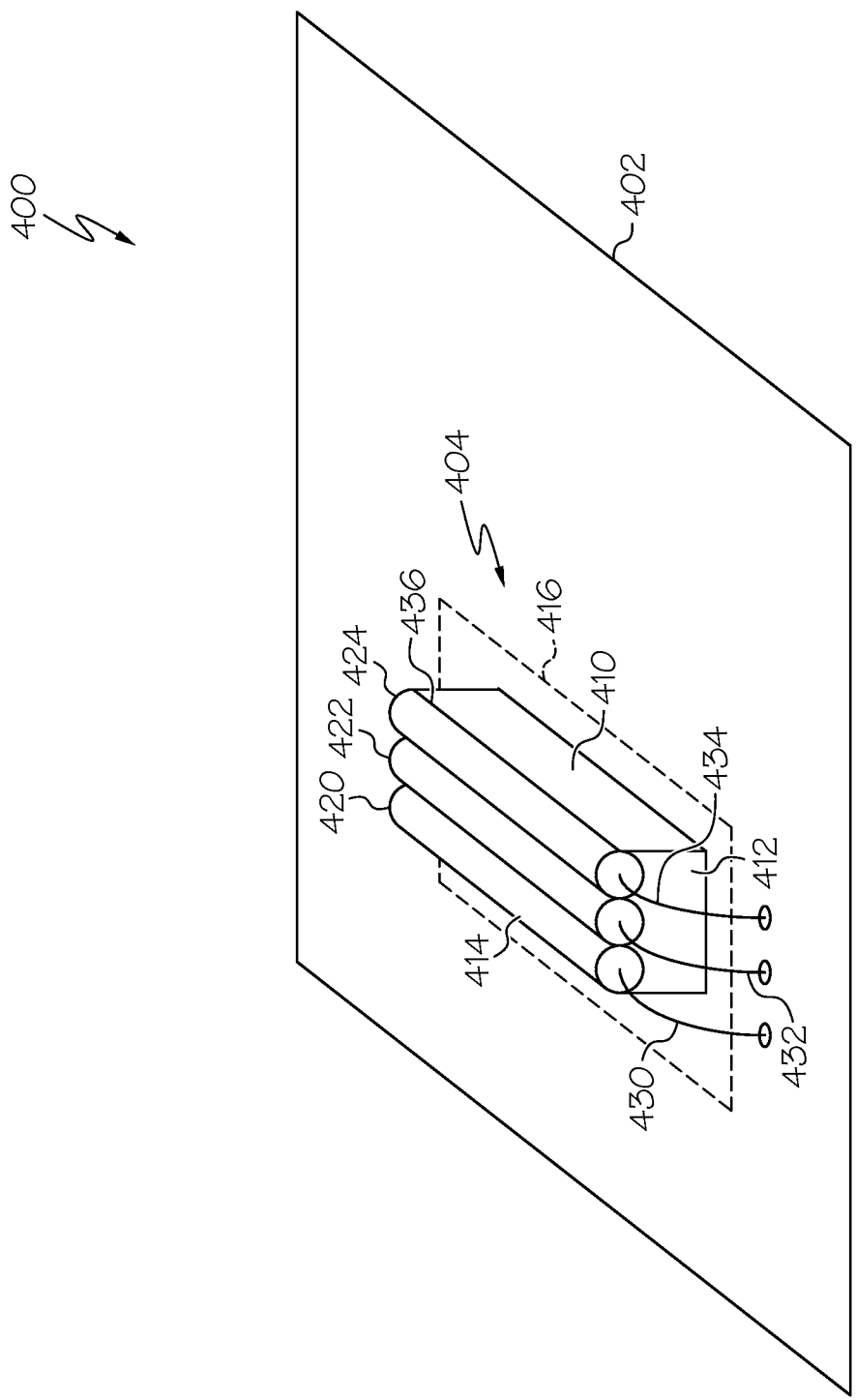
FIG. 4 illustrates a second electric shielding enclosure, according to an example.

FIG. 4 illustrates a second electric shielding enclosure 400, according to an example. The second electric shielding enclosure 400 depicts a second electrically conductive shielding enclosure 404 that is located on a circuit board 402. The circuit board 402 has a ground plane 416 embedded therein that extends over the bottom of the enclosed volume that is enclosed by conductive structures of the second electrically conductive shielding enclosure 404. The ground plane 416 forms the bottom of the second electrically conductive shielding enclosure 404 in this example. The ground plane 416 is similar to the ground plane 214 discussed above with regards to the side view cross section 200 of FIG. 2, and is able to consist of a conductive area that is located on an exterior surface of the circuit board 220 or within the circuit board 220. The ground plane 416 is electrically connected to the ground potential of the circuit board 402 and is at the electrical ground potential for the electronic device containing the circuit board 402.

The second electrically conductive shielding enclosure 404 has a power pack 414 that consist of a number of cylindrical batteries. The power pack 414 has a first battery 420, a second battery 422, and a third battery 424. Each of the cylindrical batteries has a conductive power pack surface that is at a voltage potential equal to the ground potential for the circuit board 402 and any other electrical components to which it is connected.

The power pack 414 is located in proximity to an opening 436 of a conductive structure that includes a side wall 410 and a front wall 412. This conductive structure further includes other walls that are parallel to the side wall 410 and the front wall 412 but are behind other illustrated components of the second electric shielding enclosure 400. In this example, the conductive structure is electrically connected to the ground plane 416 and is thereby connected to the ground potential of the circuit board 402.

In one example, the conductive power pack surfaces of each of the cylindrical batteries of the power pack 414 is electrically connected to the conductive structure at the point that the conductive power pack surfaces physically contact the opening 436 of the conductive structure that forms other components of the electric shielding enclosure. The opening 436 in this example is formed by an edge of the conductive structure that includes the side wall 410 and a front wall 412. In one example, an exposed negative electrode of the power pack 414 is electrically coupled at a plurality of locations along the edge defining the opening 436, such as by a yieldable conductive contact engaging the conductive power pack surface, solder points or spot welds at separate locations between the opening 436 and the exposed negative electrode of the power pack 414, or combinations of these. In another example, the edge forming the opening 436 of the conductive structure is electrically coupled to the conductive power pack surface along substantially an entirety of the edge defining the opening 436, such as a yieldable conductive contact engaging the conductive power pack surface, by a continuous solder joint along the opening 436, or combinations of these. That conductive structure is electrically coupled to the ground potential of the circuit board 402 by, for example, a conductive connection to the ground plane 416. The conductive power pack surface of each battery is therefore also electrically coupled to the ground potential of the circuit board 402 through that conductive structure. This configuration provides an electrically shielding enclosure 404 that is at an electrical ground potential and that encloses a volume located within the electrically shielding enclosure 404. The electrically shielding enclosure 404 provides electrostatic and electro-dynamic isolation of components within the volume enclosed by the electrically shielding enclosure 404 and objects outside of the electrically shielding enclosure 404. Such isolation provides, for example, reduction in Radio Frequency Interference (RFI) generated by circuits within that volume, and protection of components within that volume from electrostatic discharges originating from objects outside of that volume.

Each cylindrical battery in this example has a respective conductor connecting a positive terminal of the battery to the circuit board 402. As illustrated, the first battery 420 has a first positive conductor 430 connected to a conductor of the circuit board 402. The second battery 422 has a second positive conductor 432 and the third battery 424 has a third positive conductor 434 that are also connected to a conductor of the circuit board 402. In the illustrated example, the more negative voltage output of the power pack 414 is the conductive power pack surface of each battery, which is electrically connected to the ground potential of the circuit board 402 as part of the grounding of the electric shield that is formed in part by the conductive power pack surface. In further examples, the power pack 414 is able to have an additional electrical connection between its more negative voltage output and the ground potential of the circuit board 402.

Figure 5:
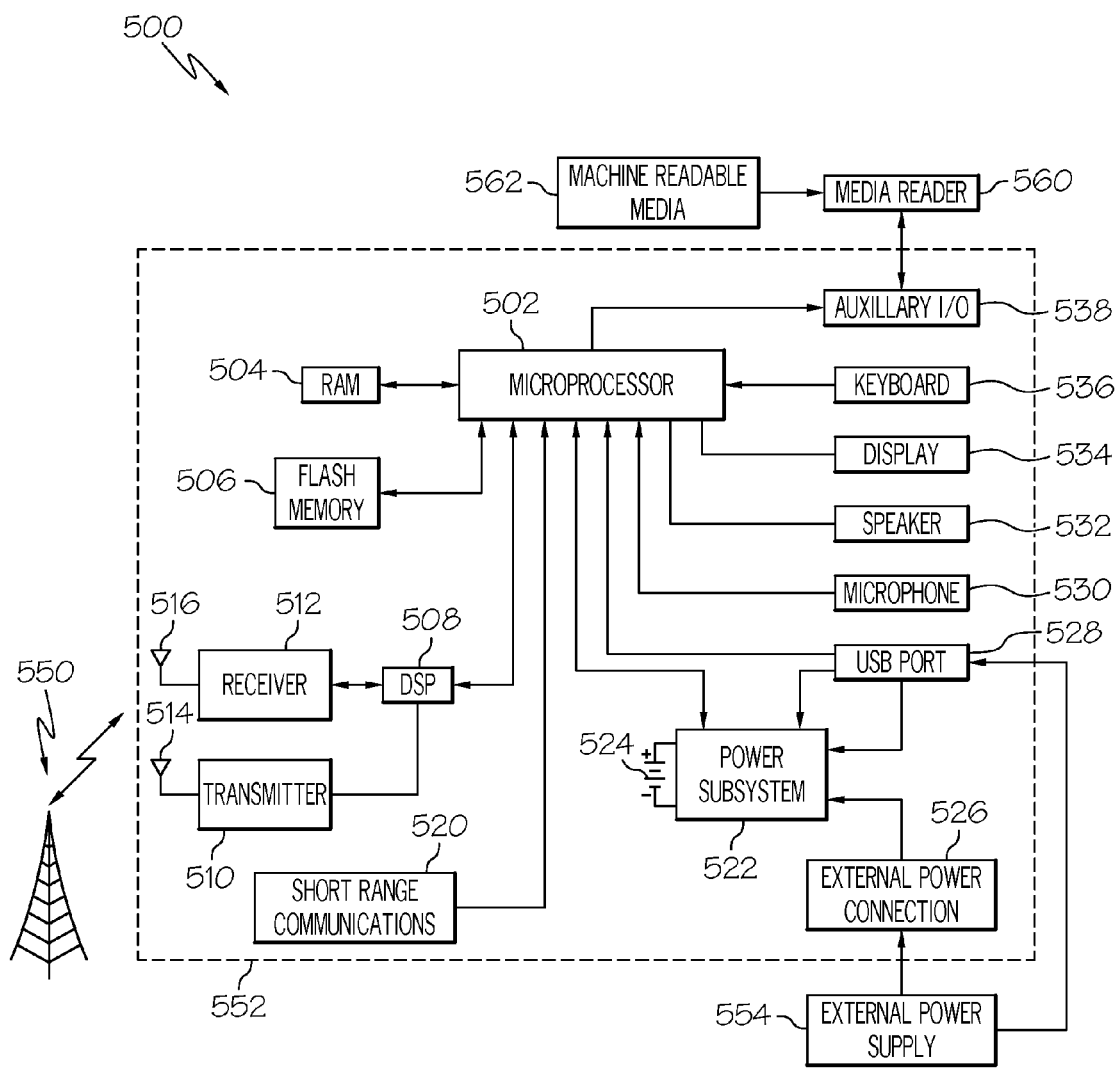
FIG. 5 is a block diagram of an electronic device and associated components in which the systems and methods disclosed herein may be implemented.

FIG. 5 is a block diagram of an electronic device and associated components 500 in which the systems and methods disclosed herein may be implemented. In this example, an electronic device 552 is also a wireless two-way communication device with voice and data communication capabilities. The electronic device 552 is an example of the electronic device 110 described above. Such electronic devices communicate with a wireless voice or data network 550 using a suitable wireless communications protocol. Wireless voice communications are performed using either an analog or digital wireless communication channel. Data communications allow the electronic device 552 to communicate with other computer systems via the Internet. Examples of electronic devices that are able to incorporate the above described systems and methods include, for example, a data messaging device, a two-way pager, a cellular telephone with data messaging capabilities, a wireless Internet appliance or a data communication device that may or may not include telephony capabilities. Such electronic devices may be portable, that is, readily movable from place to place. The electronic device 350 described above is an example of the electronic device 552.

The illustrated electronic device 552 is an example electronic device that includes two-way wireless communications functions. Such electronic devices incorporate communication subsystem elements such as a wireless transmitter 510, a wireless receiver 512, and associated components such as one or more antenna elements 514 and 516. The one or more antenna elements 514 and 516 are examples of the antenna 280 discussed above. A digital signal processor (DSP) 508 performs processing to extract data from received wireless signals and to generate signals to be transmitted. The particular design of the communication subsystem is dependent upon the communication network and associated wireless communications protocols with which the device is intended to operate.

The electronic device 552 includes a microprocessor 502 that controls the overall operation of the electronic device 552. The microprocessor 502 interacts with the above described communications subsystem elements and also interacts with other device subsystems such as flash memory 506, random access memory (RAM) 504, auxiliary input/output (I/O) device 538, data port 528, display 534, keyboard 536, speaker 532, microphone 530, a short-range communications subsystem 520, a power subsystem 522, other subsystems, or combinations of these.

One or more power storage or supply elements, such as a battery 524, are connected to a power subsystem 522 to provide power to the circuits of the electronic device 552. The batter 524 is an example of the power pack 202 discussed above. The power subsystem 522 includes power distribution circuitry for providing power to the electronic device 552 and also contains battery charging circuitry to manage recharging the battery 524 (or circuitry to replenish power to another power storage element). The power subsystem 522 receives electrical power from external power supply 554. The power subsystem 522 is able to be connected to the external power supply 554 through a dedicated external power connector (not shown) or through power connections within the data port 528. The power subsystem 522 includes a battery monitoring circuit that is operable to provide a status of one or more battery status indicators, such as remaining capacity, temperature, voltage, electrical current consumption, and the like, to various components of the electronic device 552.

Data communication through data port 528 enables a user to set preferences through the external device or through a software application and extends the capabilities of the device by enabling information or software exchange through direct connections between the electronic device 552 and external data sources rather than via a wireless data communication network. In addition to data communication, the data port 528 provides power to the power subsystem 522 to charge the battery 524 or to supply power to the electronic circuits, such as microprocessor 502, of the electronic device 552.

Operating system software used by the microprocessor 502 is stored in flash memory 506. Further examples are able to use a battery backed-up RAM or other non-volatile storage data elements to store operating systems, other executable programs, or both. The operating system software, device application software, or parts thereof, are able to be temporarily loaded into volatile data storage such as RAM 504. Data received via wireless communication signals or through wired communications are also able to be stored to RAM 504.

The microprocessor 502, in addition to its operating system functions, is able to execute software applications on the electronic device 552. A set of applications that control basic device operations, including at least data and voice communication applications, is able to be installed on the electronic device 552 during manufacture. Examples of applications that are able to be loaded onto the device may be a personal information manager (PIM) application having the ability to organize and manage data items relating to the device user, such as, but not limited to, e-mail, calendar events, voice mails, appointments, and task items. The microprocessor 502 is further able to perform part or all of the above described processing.

Further applications may also be loaded onto the electronic device 552 through, for example, the wireless network 550, an auxiliary I/O device 538, Data port 528, short-range communications subsystem 520, or any combination of these interfaces. Such applications are then able to be installed by a user in the RAM 504 or a non-volatile store for execution by the microprocessor 502.

In a data communication mode, a received signal such as a text message or web page download is processed by the communication subsystem, including wireless receiver 512 and wireless transmitter 510, and communicated data is provided the microprocessor 502, which is able to further process the received data for output to the display 534, or alternatively, to an auxiliary I/O device 538 or the Data port 528. A user of the electronic device 552 may also compose data items, such as e-mail messages, using the keyboard 536, which is able to include a complete alphanumeric keyboard or a telephone-type keypad, in conjunction with the display 534 and possibly an auxiliary I/O device 538. Such composed items are then able to be transmitted over a communication network through the communication subsystem.

For voice communications, overall operation of the electronic device 552 is substantially similar, except that received signals are generally provided to a speaker 532 and signals for transmission are generally produced by a microphone 530. Alternative voice or audio I/O subsystems, such as a voice message recording subsystem, may also be implemented on the electronic device 552. Although voice or audio signal output is generally accomplished primarily through the speaker 532, the display 534 may also be used to provide an indication of the identity of a calling party, the duration of a voice call, or other voice call related information, for example.

Depending on conditions or statuses of the electronic device 552, one or more particular functions associated with a subsystem circuit may be disabled, or an entire subsystem circuit may be disabled. For example, if the battery temperature is low, then voice functions may be disabled, but data communications, such as e-mail, may still be enabled over the communication subsystem.

A short-range communications subsystem 520 in one example is a short range wireless data communications component that provides data communication between the electronic device 552 and different systems or devices, which need not necessarily be similar devices. For example, the short-range communications subsystem 520 includes an infrared device and associated circuits and components or a Radio Frequency based communication module such as one supporting Bluetooth® communications, to provide for communication with similarly-enabled systems and devices, including the data file transfer communications described above.

A media reader 560 is able to be connected to an auxiliary I/O device 538 to allow, for example, loading computer readable program code of a computer program product into the electronic device 552 for storage into flash memory 506. One example of a media reader 560 is an optical drive such as a CD/DVD drive, which may be used to store data to and read data from a computer readable medium or storage product such as computer readable storage media 562. Examples of suitable computer readable storage media include optical storage media such as a CD or DVD, magnetic media, or any other suitable data storage device. Media reader 560 is alternatively able to be connected to the electronic device through the Data port 528 or computer readable program code is alternatively able to be provided to the electronic device 552 through the wireless network 550.

Information Processing System

The present subject matter can be realized in hardware, software, or a combination of hardware and software. A system can be realized in a centralized fashion in one computer system, or in a distributed fashion where different elements are spread across several interconnected computer systems. Any kind of computer system—or other apparatus adapted for carrying out the methods described herein—is suitable. A typical combination of hardware and software could be a general purpose computer system with a computer program that, when being loaded and executed, controls the computer system such that it carries out the methods described herein.

The present subject matter can also be embedded in a computer program product, which comprises all the features enabling the implementation of the methods described herein, and which—when loaded in a computer system—is able to carry out these methods. Computer program in the present context means any expression, in any language, code or notation, of a set of instructions intended to cause a system having an information processing capability to perform a particular function either directly or after either or both of the following a) conversion to another language, code or, notation; and b) reproduction in a different material form.

Each computer system may include, inter alia, one or more computers and at least a computer readable medium allowing a computer to read data, instructions, messages or message packets, and other computer readable information from the computer readable medium. The computer readable medium may include computer readable storage medium embodying non-volatile memory, such as read-only memory (ROM), flash memory, disk drive memory, CD-ROM, and other permanent storage. Additionally, a computer medium may include volatile storage such as RAM, buffers, cache memory, and network circuits. Furthermore, the computer readable medium may comprise computer readable information in a transitory state medium such as a network link and/or a network interface, including a wired network or a wireless network, that allow a computer to read such computer readable information.

Non-Limiting Examples

Although specific embodiments of the subject matter have been disclosed, those having ordinary skill in the art will understand that changes can be made to the specific embodiments without departing from the spirit and scope of the disclosed subject matter. The scope of the disclosure is not to be restricted, therefore, to the specific embodiments, and it is intended that the appended claims cover any and all such applications, modifications, and embodiments within the scope of the present disclosure.

One or more embodiments of the subject matter may realize one or more possible benefits, some of which have been mentioned already. The concepts described herein can be adapted to power packs of a variety of battery chemistries, sizes, shapes and geometries. Further, the concepts described herein can be adapted to be used in a variety of electronic devices. The concepts may also be used in place of, or in concert with, other shielding techniques.

What is claimed is:

1. An electric shielding enclosure, comprising:
a conductive structure comprising a continuous conductive surface partially enclosing a volume, the conductive structure comprising an edge defining an opening into the volume; and
a conductive power pack surface that is electrically coupled across the conductive power pack surface and positioned at a location that is in proximity to the opening, the conductive power pack surface extending across and closing at least a part of the opening, the conductive structure and the conductive power pack surface positioned at the location forming a conductive enclosure that provides an electromagnetic shield for the volume,
the conductive power pack surface comprising a plurality of conductive connections, the plurality of conductive connections comprising:
a first conductive connection electrically coupled at a first point to the conductive power pack surface; and
a second conductive connection electrically coupled at a second point to the conductive power pack surface,
wherein the second point is located across the opening from the first point, and
each of the conductive connections within the conductive connections is electrically coupled to the conductive structure.

2. The electric shielding enclosure of claim 1, wherein the conductive power pack surface at the first point and at the second point comprises a negative electrode of a battery contained within the conductive power pack surface.

3. The electric shielding enclosure of claim 1, the conductive power pack surface having a respective length in each of three orthogonal dimensions,
the respective length in each of the three orthogonal dimensions comprising a longest length in a first dimension within the three orthogonal dimensions, the longest length separating a first edge and a second edge of the conductive power pack surface,
wherein the first point is near the first edge and the second point is near the second edge.

4. The electric shielding enclosure of claim 1, wherein the conductive power pack surface comprises an exposed negative electrode of a battery contained within the conductive power pack surface and the conductive power pack surface is ohmically coupled to the exposed negative electrode of a battery and to the conductive structure, and
wherein the plurality of conductive connections comprise electrical coupling between the exposed negative electrode and the conductive structure partially enclosing the volume.

5. The electric shielding enclosure of claim 4, wherein the conductive structure is electrically coupled to the exposed negative electrode at a plurality of locations along the edge defining the opening.

6. The electric shielding enclosure of claim 4, wherein the conductive structure is electrically coupled to the conductive power pack surface along substantially an entirety of the edge defining the opening.

7. The electric shielding enclosure of claim 1, the conductive structure at least partially enclosing an electronic circuit, and wherein the conductive structure comprises a conductor forming a ground plane extending under the electronic circuit that is enclosed by the conductive structure.

8. An electronic device, comprising:
a case;
a conductive structure located at least partially within the case, the conductive structure comprising a continuous conductive surface partially enclosing a volume within the case, the conductive structure comprising an edge defining an opening into the volume; and
a conductive power pack surface that is electrically coupled across the conductive power pack surface and positioned at a location that is in proximity to the opening, the conductive power pack surface extending across and closing at least a part of the opening when physically coupled to the case, the conductive structure and the conductive power pack surface positioned at the location forming a conductive enclosure that provides an electromagnetic shield for the volume,
the conductive power pack surface comprising a plurality of conductive connections, the plurality of conductive connections comprising:
a first conductive connection electrically coupled at a first point to the conductive power pack surface; and
a second conductive connection electrically coupled at a second point to the conductive power pack surface,
wherein the second point is located across the opening from the first point, and
each of the conductive connections within the conductive connections is electrically coupled to the conductive structure.

9. The electronic device of claim 8, wherein the conductive power pack surface at the first point and at the second point comprises a negative electrode of a battery contained within the conductive power pack surface.

10. The electronic device of claim 8, the conductive power pack surface having a respective length in each of three orthogonal dimensions,
the respective length in each of the three orthogonal dimensions comprising a longest length in a first dimension within the three orthogonal dimensions, the longest length separating a first edge and a second edge of the conductive power pack surface,
wherein the first point is near the first edge and the second point is near the second edge.

11. The electronic device of claim 8, wherein the conductive power pack surface comprises an exposed negative electrode of a battery contained within the conductive power pack surface and the conductive power pack surface is ohmically coupled to the exposed negative electrode of a battery and to the conductive structure, and wherein the plurality of conductive connections comprise electrical coupling between the exposed negative electrode and the conductive structure partially enclosing the volume.

12. The electronic device of claim 11, wherein the conductive structure is electrically coupled to the exposed negative electrode at a plurality of locations along the edge defining the opening.

13. The electronic device of claim 11, wherein the conductive structure is electrically coupled to the conductive power pack surface along substantially an entirety of the edge defining the opening.

14. The electronic device of claim 8, the conductive structure at least partially enclosing an electronic circuit, and wherein the conductive structure comprises a conductor forming a ground plane extending under the electronic circuit that is enclosed by the conductive structure.

* * * * *